United States Patent

Yagi

[11] Patent Number: 6,143,637
[45] Date of Patent: Nov. 7, 2000

[54] PROCESS FOR PRODUCTION OF SEMICONDUCTOR DEVICE AND CLEANING DEVICE USED THEREIN

[75] Inventor: Hideaki Yagi, Tokyo, Japan

[73] Assignee: NEC Corporation, Tokyo, Japan

[21] Appl. No.: 09/265,591

[22] Filed: Mar. 10, 1999

[30] Foreign Application Priority Data

Mar. 13, 1998 [JP] Japan ................................. 10-063097

[51] Int. Cl.⁷ .................................................. H01L 21/44
[52] U.S. Cl. ........................... 438/597; 438/128; 438/600
[58] Field of Search .................................. 438/597, 600, 438/128

[56] References Cited

U.S. PATENT DOCUMENTS

| | | | |
|---|---|---|---|
| 5,000,208 | 3/1991 | Ludwig et al. | 134/58 R |
| 5,001,084 | 3/1991 | Kawai et al. | 437/231 |
| 5,100,476 | 3/1992 | Mase et al. | 134/1 |
| 5,158,100 | 10/1992 | Tanaka et al. | 134/105 |
| 5,435,075 | 7/1995 | Shiraishi et al. | 34/58 |
| 5,634,980 | 6/1997 | Tomita et al. | 134/3 |
| 5,670,019 | 9/1997 | Huang | 156/643.1 |
| 5,876,509 | 3/1999 | Nam | 134/3 |
| 5,896,875 | 4/1999 | Yoneda | 134/102.3 |

FOREIGN PATENT DOCUMENTS

| | | |
|---|---|---|
| 0 444 756 | 9/1991 | European Pat. Off. . |
| 0 548 596 | 6/1993 | European Pat. Off. . |
| 0 841 689 | 5/1998 | European Pat. Off. . |
| 63-185029 | 7/1988 | Japan . |
| 2-39531 | 2/1990 | Japan . |
| 5-347293 | 12/1993 | Japan . |
| 7-31941 | 2/1995 | Japan . |
| 7-45574 | 2/1995 | Japan . |
| 7-221064 | 8/1995 | Japan . |
| 7-271056 | 10/1995 | Japan . |
| 9-59685 | 3/1997 | Japan . |
| 9-69509 | 3/1997 | Japan . |
| 92/20985 | 11/1992 | WIPO . |

*Primary Examiner*—Vu A. Le
*Assistant Examiner*—Pho Luu
*Attorney, Agent, or Firm*—Foley & Lardner

[57] ABSTRACT

The present invention provides a process for producing a semiconductor device, which comprises: a step of forming a metal wiring pattern on a semiconductor wafer, a step of arranging a plurality of the wiring pattern-formed semiconductor wafers and cleaning them with a cleaning solution (a cleaning step), a step of rotating the cleaned semiconductor wafers at a high speed to swing off the cleaning solution adhering to the semiconductor wafers (a swinging-off step), and a step of rinsing the cleaning solution-removed semiconductor wafers with pure water (a rinsing step). According to the present process for production of semiconductor device, the foreign matter and residue appearing in the step of formation of metal wiring pattern can be removed without incurring corrosion of the metal wiring and a semiconductor device of high quality can be produced at a low cost.

8 Claims, 2 Drawing Sheets

PROCESS FOR PRODUCTION OF SEMICONDUCTOR DEVICE AND CLEANING DEVICE USED THEREIN

BACKGROUND OF THE INVENTION

1. Field of the Invention

The present invention relates to a process for production of semiconductor device and a cleaning device used in the method.

2. Description of the Related Art

In the process for production of semiconductor device, each semiconductor wafer after the step of wiring pattern formation thereon is cleaned to remove the foreign matter and residue appearing during said step and adhering to the wiring.

The above step of wiring pattern formation is ordinarily conducted as follows. On the semiconductor substrate on which semiconductor elements have been formed, is formed a metal film made of a wiring material; then, a resist film is formed on the metal film; the resist film is subjected to photolithography to form a fine resist pattern; using the resist pattern as a mask, the metal film is dry-etched; and the resist pattern on the metal film is removed by plasma ashing or the like, to form a wiring pattern. In this step of wiring pattern formation, however, foreign matter and residue appear at the time of dry-etching of metal film and subsequent removal of resist pattern and adhere to the metal wiring. The foreign matter and residue adhering to the metal wiring give rise to various wiring defects, incurring reduction in productivity as well in performance and reliability of final product, i.e. semiconductor device. Therefore, in order to remove the foreign matter and residue, cleaning is conducted after the step of wiring pattern formation.

For cleaning of the foreign matter and residue, there is ordinarily conducted wet cleaning using an organic cleaning solution, an acidic cleaning solution, an alkaline cleaning solution or the like, after which rinsing with pure water is conducted lastly.

When the wiring pattern is fine, cleaning of the foreign matter and residue is conducted by using, as the cleaning solution, mainly an organic cleaning solution which gives relatively low corrosion to the metal wiring. Ordinary organic cleaning solutions, however, are low in cleaning power and have various problems; for example, a treatment using an aqueous alkali solution (has corrosivity) is necessary before the cleaning with organic cleaning solution because of its low cleaning power, and prerinsing using an organic solvent of high flash point (e.g. isopropyl alcohol) is necessary after the cleaning with organic cleaning solution but before rinsing with pure water.

Hence, an organic cleaning solution containing a fluorine compound (e.g. ammonium fluoride) is in use in place of the ordinary organic cleaning solution. This organic cleaning solution comprises a fluorine compound (e.g. ammonium fluoride), a solvent (e.g. dimethyl sulfoxide) and water in given proportions. The ammonium fluoride contained in the cleaning solution has an action of removing the metallic foreign matter and residue adhering to metal wiring (their removal with solvent is impossible), by etching the oxide-film formed spontaneously between the wiring and the foreign matter and residue adhering to the wiring. Meanwhile, the solvent contained in the cleaning solution dissolves and removes resinous foreign matter and residue. Consequently, the organic cleaning solution containing a fluorine compound can sufficiently remove both the metallic foreign matter and residue and the resinous foreign matter and residue, and no treatment using a corrosive alkali solution is necessary. Further, the organic cleaning solution exhibits the above-mentioned excellent cleaning power at relatively low temperatures of about room temperature (25° C.). Furthermore, since the organic cleaning solution has been thought to show substantially no corrosiveness to the metal wiring, no prerinsing has been conducted and rinsing with pure water has been conducted right after the cleaning with the organic cleaning solution. Incidentally, prerinsing incurs an increased cost due to the use of prerinsing solvent, requires an additional step of prerinsing and also a step of disposal of waste solution and, therefore, makes, the whole process disadvantageous; moreover, the fluorine compound and the prerinsing solvent react with each other in some cases, which poses a problem. Thus, it is preferred that no rinsing is conducted.

Other cleaning solutions containing a fluorine compound are disclosed in JP-A-7-271056. In the literature are disclosed a peeling solution for photoresist, consisting of an aqueous solution comprising a particular ammonium salt of organic carboxylic acid or a particular amine salt of organic carboxylic acid and a fluorine compound in given proportions; and a peeling solution for photoresist, consisting of an aqueous solution comprising a particular ammonium salt of organic carboxylic acid or a particular amine salt of organic carboxylic acid, a fluorine compound and a particular organic solvent in given proportions.

In recent years, as semiconductor devices have become smaller in size and more highly integrated, a finer wiring pattern has become necessary, and the width of each wiring and the distances between adjacent wirings have become finer. In cleaning of such a fine wiring pattern, even very slight corrosion of wiring (which has not been a problem in cleaning of conventional wiring pattern) changes the size (dimension) of wiring pattern significantly, and the wiring pattern after cleaning is different from the dimension of designing stage. As a result, the wiring pattern after cleaning comes to have various wiring defects such as poor contact, short-circuiting and the like.

Thus, even in the cleaning with the abovementioned cleaning solution containing a fluorine compound, there has come to arise a problem that a wiring is corroded in the pure water rinsing after cleaning with the above cleaning solution. The corrosion of wiring in the pure water rinsing is particularly striking when a plurality of semiconductor wafers are arrayed at given intervals and they are cleaned and rinsed together. Treating a plurality of semiconductor wafers together is essential for simplification of production process and lower cost. Therefore, striking appearance of corrosion in such treatment is a serious problem because the request for semiconductor device of lower cost is becoming increasingly higher.

SUMMARY OF THE INVENTION

The present invention is intended to provide a process for production of semiconductor device, wherein the foreign matter and residue appearing in the step of formation of metal wiring pattern can be removed without incurring corrosion of the metal wiring and a semiconductor device of high quality can be produced at a low cost; and a cleaning device used in the above process.

The present invention lies in a process for producing a semiconductor device, which comprises:

a step of forming a metal wiring pattern on a semiconductor wafer, a step of arranging a plurality of the wiring pattern-formed semiconductor wafers and cleaning them with a cleaning solution (a cleaning step), a step of rotating the cleaned semiconductor wafers at a high speed to swing off the cleaning solution adhering to the semiconductor wafers (a swinging-off step), and a step of rinsing the cleaning solution-removed semiconductor wafers with pure water (a rinsing step).

The present invention lies also in a cleaning device having:

a means for holding a plurality of arrayed semiconductor wafers each having an aluminum-based wiring pattern formed thereon and rotating the semiconductor wafers (a holding and rotating means), a means for spraying a fluorine compound-containing cleaning solution onto the semiconductor wafers (a cleaning solution-feeding means), a means for spraying pure water onto the semiconductor wafers ( a pure water-feeding means), and a means for spraying an inert gas onto the semiconductor wafers (an inert gas-feeding means).

According to the present process for production of semiconductor device, the foreign matter and residue appearing in the step of formation of metal wiring pattern can be removed without incurring corrosion of the metal wiring and a semiconductor device of high quality can be produced at a low cost. Further, since the cleaning solution adhering to the semiconductor wafers can be almost completely removed in the swinging-off step, it is not necessary to conduct a conventional prerinsing step using a solvent, the rinsing step can be simple, and there can be prevented the reduction in quality and reliability of semiconductor device, caused by the remaining of cleaning solution.

DETAILED DESCRIPTION OF THE PREFERRED EMBODIMENTS

Figure 1:
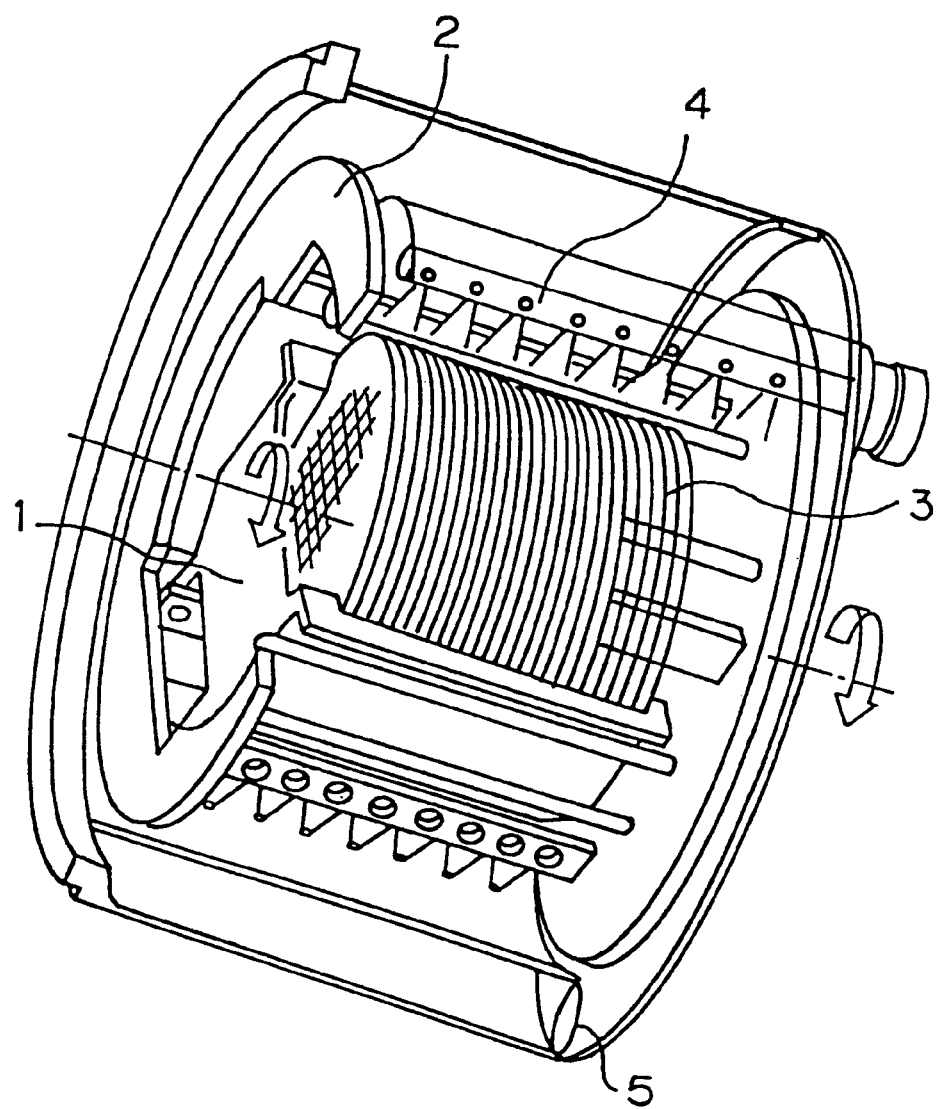
FIG. 1 shows a schematic constitution of a treating chamber used in an embodiment of the cleaning device of the present invention.

The present invention is hereinafter described in detail by way of embodiments.

In the process of the present invention, formation of wiring pattern is conducted, for example, as follows according to an ordinary method. First, a metal film made of a wiring material is formed, by metal sputtering or the like, on a wafer on which a diffused layer, an insulation film, etc. have been formed. Then, on this metal film is formed a resist film by coating. The resist film is subjected to photolithography to form a fine resist pattern. Subsequently, the metal film is dry-etched using the resist pattern as a mask. The resist pattern on the metal film is removed by plasma ashing or the like, whereby a wiring pattern is formed.

The process of the present invention is particularly effective when there is formed a wiring pattern made of an aluminum-based wiring material, i.e. an aluminum-based wiring pattern. The aluminum-based wiring material includes Al and aluminum alloys such as Al-Si, Al-Cu, Al-Si-Cu and the like.

In dry-etching of the metal film made of an aluminum-based wiring material, there is used a gas containing a chlorine compound such as boron trichloride, carbon tetrachloride, chlorine, hydrogen chloride, silicon tetrachloride or the like.

The wafer on which a wiring pattern has been formed as above, is cleaned, for example, as follows.

First, a plurality of wafers are mounted on a cleaning device at given intervals and cleaned with a cleaning solution at around room temperature for about 5 to 10 minutes (a cleaning step). This cleaning can be conducted by a spraying type wet treatment, a DIP type wet treatment or the like. Then, the wafers are rotated at a high speed to swing off the cleaning solution adhering to the wafers (a swinging-off step). Thereafter, the wafers are rinsed with pure water at room temperature for about 5 to 10 minutes (a rinsing step). The wafers are finally dried by spin drying or the like (a drying step).

In the cleaning step of the present process, the cleaning solution used is preferably a cleaning solution containing a fluorine compound, more preferably a cleaning solution containing a fluorine compound, a solvent and water.

The fluorine compound contained in the cleaning solution includes ammonium fluoride, ammonium hydrogenfluoride, hydrofluoric acid, ammonium borofluoride, etc. Of these, ammonium fluoride is preferred. The content of the fluorine compound is preferably 0.1 to 10% by weight, more preferably 0.5 to 5% by weight. When the content is too small, the resulting cleaning solution has low cleaning power. When the content is too large, the resulting cleaning solution causes corrosion of wiring during cleaning.

As the solvent contained in the cleaning solution, an organic solvent capable of dissolving resins is used. As such a solvent, there are mentioned, for example, sulfoxides such as dimethyl sulfoxide and the like; amides such as dimethylformamide, dimethylacetamide, N-methylpyrrolidone and the like; lactones such as γ-butyrolactone and the like; and nitriles such as acetonitrile, benzonitrile and the like. Of these, dimethyl sulfoxide is preferred. The content of the solvent in the cleaning solution is such that the solvent can remove resinous foreign matter and residue. When the content is too small, the resulting cleaning solution has low cleaning power and, moreover, an increase of water in cleaning solution invites higher corrosivity of cleaning solution. In the embodiment of the present invention, the content of the solvent in the cleaning solution is preferably 30 to 90% by weight, more preferably 50 to 80% by weight.

The type of cleaning can be a spraying type wet treatment, a DIP type wet treatment or the like. In the spraying type wet treatment, when a cleaning solution is discharged and sprayed onto wafers, a physical force, i.e. the discharging pressure of cleaning solution acts on the foreign matter and residue adhering to the wiring pattern of the wafers and a higher cleaning effect is obtained. Therefore, cleaning by the spraying type wet treatment is preferred.

The temperature of cleaning is sufficiently around ordinary temperature, but may be elevated as long as no decomposition of active component of cleaning solution and no resultant reduction in cleaning power take place. There is no particular restriction as to the time of cleaning, and it is appropriately selected depending upon the type of cleaning, the kinds of wiring material and resist, the amount of foreign matter and residue, the active component of cleaning solution, the temperature of cleaning, etc.

In the swinging-off step, it is preferred to spray an inert gas such as nitrogen, helium or the like. This spraying of inert gas enhances the effect of removing the cleaning solution adhering to wafers. The spraying of inert gas has not only an effect of physical removal of cleaning solution by gas but also an effect of replacing the atmosphere around the wafers in cleaning device, with a dry gas. The flow rate of the inert gas is 80 to 100 l/min to exhibit a satisfactory effect, in the embodiment of the present invention.

Further, the inert gas is preferably a heated inert gas of about 100 to 150° C. With such a heated inert gas, the solvent, water and other volatile component in cleaning solution can easily vaporize and the cleaning solution can be removed at a higher efficiency.

The number of rotations in the swinging-off step is controlled to a level at which the cleaning solution can be swung off sufficiently. A higher rotational speed is preferred in order to complete the swinging-off operation in a relatively short time. In the embodiment of the present invention, a sufficient effect can be obtained at about 1,000 to 2,000 rpm. The time of swinging-off operation is appropriately set depending upon the number of rotations, the amount and temperature of inert gas introduced, etc., but is preferably about 1 to 10 minutes.

The rinsing step is conducted according to an ordinary method. When a spraying type wet treatment is employed in the cleaning step, rinsing is conducted preferably by spraying pure water onto wafers. Prerinsing with an aqueous weakly acidic solution may be conducted prior to the rinsing.

The drying step is also conducted according to an ordinary method. When a spraying type wet treatment is employed in the cleaning step, it is preferred to conduct spin drying at a desired temperature and a desired number of rotations.

In FIG. 1 is shown a schematic constitution of a treating chamber used in an embodiment of the cleaning device of the present invention.

The treating chamber is made of SUS inside. Inside the treating chamber is provided a rotor 2 which holds and rotates a carrier 1. On the carrier 1 are mounted a plurality of wafers 3 at given intervals. In the circumference of the carrier 1 are provided a plurality of spraying parts 4 capable of discharging a cleaning solution, nitrogen, pure water and optionally an aqueous weakly acidic solution. The spraying parts 4 has one or more nozzle(s). These spraying parts may be provided independently for each substance to be discharged, or two or more substances may be discharged from one spraying part. For example, if a spraying part for discharging of pure water is used also for discharging of nitrogen, nitrogen can be discharged from a plurality of spraying parts, that is, from a spraying part exclusively used for nitrogen and also from said spraying part for discharging of pure water. It is also possible that a switching valve is fitted to the feed line connected to a spraying part, an aqueous weakly acidic solution is discharged, and the valve is switched and pure water is discharged. The cleaning solution, pure water, etc. sprayed onto wafers are discharged out of the treating chamber as a waste solution through a waste solution outlet 5.

EXAMPLE

Using a cleaning device provided with the above treating chamber, wafers each having an aluminum wiring pattern (wiring width=0.44 $\mu$m, distance between adjacent wirings= 0.32 $\mu$m) formed thereon were cleaned as follows.

There was used a cleaning solution containing 1% by weight of ammonium fluoride, 69% by weight of dimethyl sulfoxide and 30% by weight of water.

A carrier having 25 wafers mounted thereon was fitted in the treating chamber. While the rotor was rotated at 35 rpm, the cleaning solution was discharged from spraying part at 23° C. and sprayed onto the wafers for 5 minutes (cleaning step).

Then, the rotational frequency of the rotor was increased to 1,500 rpm to swing off the cleaning solution adhering to the wafers and, simultaneously therewith, nitrogen gas of 120° C. was discharged from two spraying parts and sprayed onto the wafers for 1 minute (swinging-off step).

Successively, the rotational frequency of the rotor was controlled appropriately, and pure water was discharged from two spraying parts at 23° C. and sprayed onto the wafers to conduct rinsing for about 10 minutes according to an ordinary method (rinsing step). Thereafter, spin drying was conducted according to an ordinary method (drying step).

After the spin drying, the section of one wafer (the 13th counting from the carrier end) was observed by the use of a scanning electron microscope. As a result, there was no change in size of wiring, no corrosion of wiring, or no presence of foreign matter or residue. Meanwhile, for comparison, the same wafers as used above were treated in the same manner except that no swinging-off step was conducted, and were observed in the same manner. As a result, the width of wiring was smaller by 0.1 $\mu$m. That is, the width of wiring changed by even 23% owing to the cleaning which did not include swinging-off.

Figure 2:
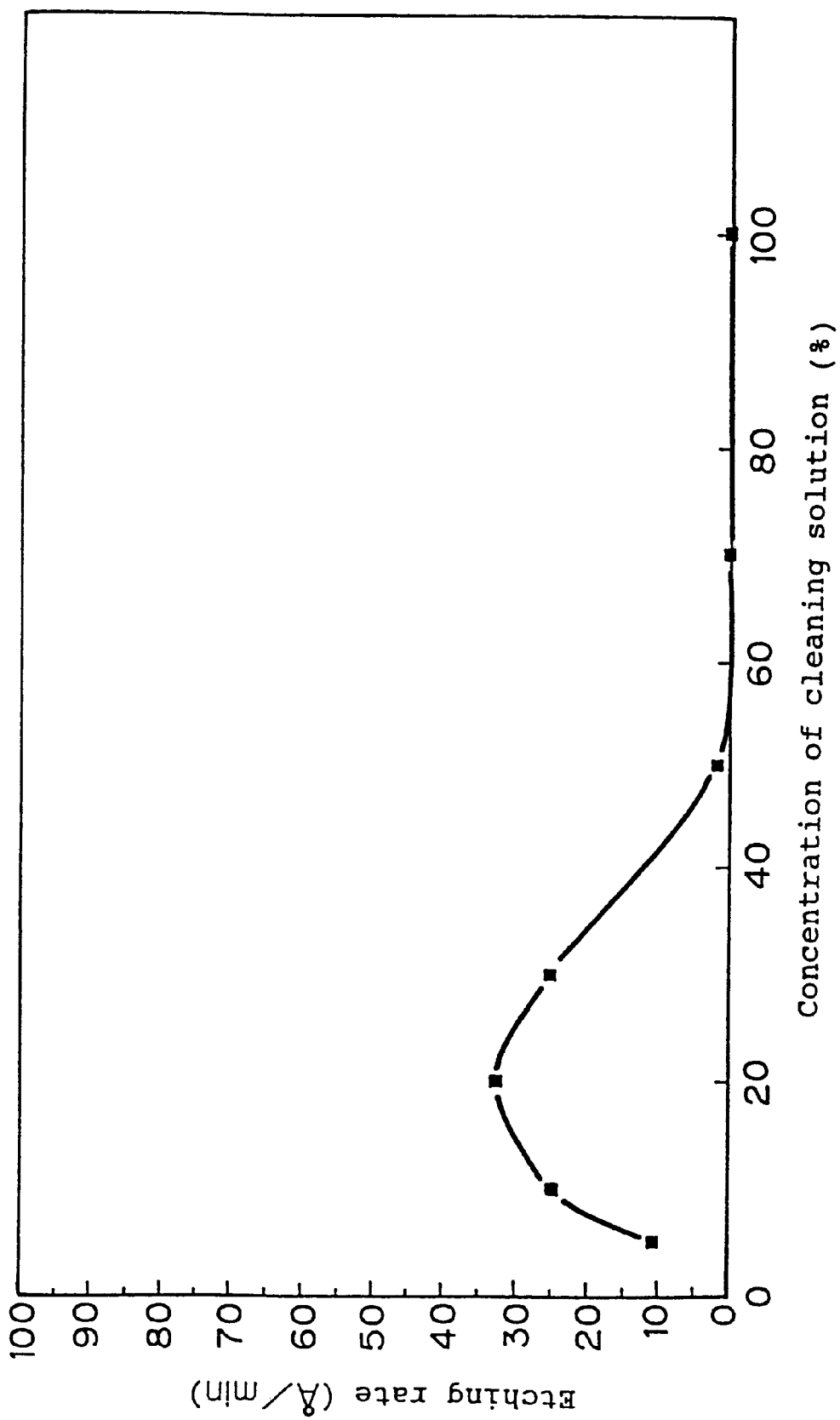
FIG. 2 is a graph showing a change of the etching rate of aluminum to the concentration of the cleaning solution used in the Example of the present invention.

In order to investigate the above effect, the present inventor conducted a test for examining the corrosivity to aluminum, of the cleaning solution used in the present Example. FIG. 2 is a graph showing a change of the etching rate of aluminum to the concentration of the cleaning solution used in the above Example. The cleaning solution concentration of abscissa is expressed in (cleaning solution amount)/(cleaning solution amount+added water amount); the etching rate at cleaning solution concentration 100% is the etching rate of the cleaning solution used in the present Example; and the etching rates at low cleaning solution concentrations are etching rates when said cleaning solution has been diluted with water.

As is clear from this graph, even when the cleaning solution per se has no corrosivity, corrosivity appears when the solution is diluted with water. Therefore, it is presumed that even when no corrosion of wiring takes place in the cleaning step, if the cleaning solution remains on wafers in the rinsing step, the remaining cleaning solution is diluted with pure water (for rinsing) and corrosivity appears, inviting corrosion of wiring. It is presumed that in the process of the present invention wherein the swinging-off step is conducted, since the cleaning solution adhering to wafers in the cleaning step can be almost completely removed in the swinging-off step and no cleaning solution remains on the wafers, no corrosion of wiring takes place in the subsequent rinsing step.

What is claimed is:

1. A process for producing a semiconductor device, which comprises:
   a step of forming a metal wiring pattern on a semiconductor wafer,
   a step of arranging a plurality of the wiring pattern-formed semiconductor wafers and cleaning them with cleaning solution (a cleaning step),
   a step of rotating the cleaned semiconductor wafers at a high speed to swing off the cleaning solution adhering to the semiconductor wafers (a swinging-off step), and a step of rinsing the cleaning solution-removed semiconductor wafers with pure water (a rinsing step).

2. A process according to claim 1, wherein in the swinging-off step, the semiconductor wafers are rotated at a high speed while an inert gas is sprayed onto the wafers.

3. A process for producing a semiconductor device, comprising:

a step of forming a metal wiring pattern on a semiconductor wafer;

a step of arranging a plurality of the wiring pattern-formed semiconductor wafers and cleaning them with cleaning solution (a cleaning step);

a step of rotating the cleaned semiconductor wafers at a high speed to swing off the cleaning solution adhering to the semiconductor wafers (a swinging-off step); and a step of rinsing the cleaning solution-removed semiconductor wafers with pure water (a rinsing step), wherein in the swinging-off step, the semiconductor wafers are rotated at a high speed while a heated inert gas is sprayed onto the wafers.

4. A process according to claim 1, which comprises, after the swinging-off step but before the rinsing step, a step of rinsing the semiconductor wafers with a weakly acidic solution (a prerinsing step).

5. A process according to claim 1, wherein in the cleaning step, the semiconductor wafers are cleaned by spraying a cleaning solution onto the wafers.

6. A process for producing a semiconductor device, comprising:

a step of forming a metal wiring pattern on a semiconductor wafer;

a step of arranging a plurality of the wiring pattern-formed semiconductor wafers and cleaning them with cleaning solution (a cleaning step);

a step of rotating the cleaned semiconductor wafers at a high speed to swing off the cleaning solution adhering to the semiconductor wafers (a swinging-off step); and a step of rinsing the cleaning solution-removed semiconductor wafers with pure water (a rinsing step), wherein in the cleaning step, the semiconductor wafers are cleaned by spraying a cleaning solution onto the semiconductor wafers and, wherein in the rinsing step, pure water is sprayed onto the semiconductor wafers to rinse them.

7. A process for producing a semiconductor device, comprising:

a step of forming a metal wiring pattern on a semiconductor wafer;

a step of arranging a plurality of the wiring pattern-formed semiconductor wafers and cleaning them with cleaning solution (a cleaning step);

a step of rotating the cleaned semiconductor wafers at a high speed to swing off the cleaning solution adhering to the semiconductor wafers (a swinging-off step); and a step of rinsing the cleaning solution-removed semiconductor wafers with pure water (a rinsing step), wherein the cleaning solution is a cleaning solution containing a fluorine compound.

8. A process according to claim 7, wherein the metal wiring is an aluminum-based wiring.

* * * * *